United States Patent [19]
Braun et al.

[11] 3,955,867
[45] May 11, 1976

[54] INTEGRATED CIRCUIT PACKAGE CONNECTOR WITH PROBING FACILITY

[75] Inventors: Robert E. Braun, Norristown; George J. Sprenkle, Phoenixville, both of Pa.

[73] Assignee: Burroughs Corporation, Detroit, Mich.

[22] Filed: Oct. 9, 1974

[21] Appl. No.: 513,278

[52] U.S. Cl. .......................................... 339/17 CF
[51] Int. Cl.[2] ........................................ H01K 1/12
[58] Field of Search .......... 339/17 C, 17 CF, 17 LC, 339/108 TP; 324/73 PC, 72.5, 158 F; 317/101 CC, 101 CP

[56] References Cited
UNITED STATES PATENTS

| | | | |
|---|---|---|---|
| 3,754,203 | 8/1973 | Pauza et al. | 339/17 CF |
| 3,761,808 | 9/1973 | Ryan | 324/158 F |
| 3,805,212 | 4/1974 | Landman et al. | 339/17 CF |
| 3,877,064 | 4/1975 | Scheingold et al. | 339/17 CF |

OTHER PUBLICATIONS

D. W. Ormond; "High-Temperature Multicontact Probe;" IBM Technical Disclosure Bulletin; Vol. 14, No. 2, July 1971, p. 568.

*Primary Examiner*—Joseph H. McGlynn
*Assistant Examiner*—Craig R. Feinberg
*Attorney, Agent, or Firm*—Francis A. Varallo; Edward J. Feeney, Jr.; Kevin R. Peterson

[57] ABSTRACT

A connector or receptacle is described for connecting a leadless integrated circuit package to an interconnection medium such as a printed circuit board without the need for soldering connections. A significant feature of the connector is that all of its electrical contacts may be engaged or probed individually or collectively from the package side of the interconnection board for diagnostic and test purposes. Probe means suitable for use with the connector are also described.

10 Claims, 3 Drawing Figures

INTEGRATED CIRCUIT PACKAGE CONNECTOR WITH PROBING FACILITY

CROSS-REFERENCE TO RELATED APPLICATIONS

In a first copending patent application Ser. No. 513,283 for "Packaging System for Electronic Equipment" by Robert E. Braun et al. there is described a packaging system utilizing leadless integrated circuit packages installed in connectors which incorporate the inventive concepts claimed in the present application. The hold down devices which apply a clamping force to the packages and which find utility in the system of the aforesaid first application, are claimed in a second copending patent application Ser. No. 513,282 for "Hold Down Device for Use in Electronic Systems Employing Integrated Circuits" by Peter P. Klein et al. The integrated circuits themselves may be packaged in the manner described and claimed in application Ser. No. 465,678 for "Leadless Ceramic Package for Integrated Circuit Having Heat Sink Means" by Robert S. Morse. All of the foregoing applications are assigned to the same assignee as the present application.

BACKGROUND OF THE INVENTION

The high density packaging of electronic equipment, particularly data processing systems, may involve the installation of pluggable integrated circuit packages in receptacles or connectors. The connectors in turn are mounted on an interconnection board. The electrical contacts within the connector provide electrical circuit paths between the integrated circuit package leads and the conductive pads of the interconnection board. Additionally, in such a packaging system, hold down means are generally provided to apply a clamping force to the installed integrated circuit packages to insure electrical integrity.

In any electronic system, the need will arise for checking the signal levels associated with the various electronic components to determine if they are within the design range. The results of such examination are used to pinpoint either present or possible future malfunctions of the equipment. In a high density packaging system of the type mentioned hereinbefore, the checking of the signal levels present on the multitude of integrated circuit leads becomes a complex and time consuming task. This is so mainly because heretofore, the checking of such levels required access to the electrical connections on the side of the interconnection board opposite to that on which the connector and package were mounted. The present invention obviates this difficulty, by providing a connector design which permits the probing of a single one of its electrical contacts or a plurality of contacts simultaneously while the package and hold down means are in place, and the system is in operation.

SUMMARY OF THE INVENTION

In accordance with the invention, a connector or receptacle for integrated circuit packages is provided which may be utilized in the high density packaging system described and claimed in the referenced Braun et al application. This system includes an "island" which may be characterized as a plurality of pluggable integrated circuit packages, connectors or receptacles for receiving the packages, a cooling frame and an interconnection board or medium for supporting the other elements. It should be understood, however, that the reference system has been chosen solely for illustrative purposes and that the present connector is not to be considered limited to use therein.

The connector of the present invention accepts a "leadless" integrated circuit package which may be of the single circuit type or comprises a pair of package sections each with its own circuit in a split-package configuration. In either case, the package leads may be arranged on 0.050 inch centers and the electrical contact elements of the connectors are similarly placed. The connector is fastened to the interconnection medium. Each of the connector electrical contacts is in the form of a continuous loop comprised of two adjacent geometrical sections. The first of these sections is generally in the shape of a "C" in which its upper portion presses against a terminal lead of the integrated circuit package, and its lower portion, against a conductive pad on the interconnection medium. The other contact section is an extension of the "C" and follows the contour of a substantially rectangular slotted region within the connector body and lies in a plane transverse to the longitudinal sides of the connector. An external ledge along each longitudinal side of the connector has discrete openings therein situated respectively above the last mentioned contact sections. These openings permit the engaging or electrical probing of the contacts while the integrated circuit packages are in place and the system is in operation. The use of the hold down or clamping devices described and claimed in the referenced Klein et al. copending application does not interfere with the probing facility inherent in the present connector.

The probing of the electrical contacts during operation to establish the condition of the integrated circuit package takes place on the package side of the interconnection medium, and no access to the opposite side of the medium is required. The signal levels on individual contacts may be examined with the use of standard test equipment, in which the equipment probe is inserted in turn in the aforesaid openings to engage the connector contact elements. Alternately, as will be described in detail hereinafter, a probe device which will engage all of the contact elements simultaneously may be utilized. This device is adapted to fit over the connector/hold down assembly and be used during operation of the integrated circuits.

Other features of the invention will become more fully apparent in the detailed description which follows.

DESCRIPTION OF THE PREFERRED EMBODIMENT

Figure 1:
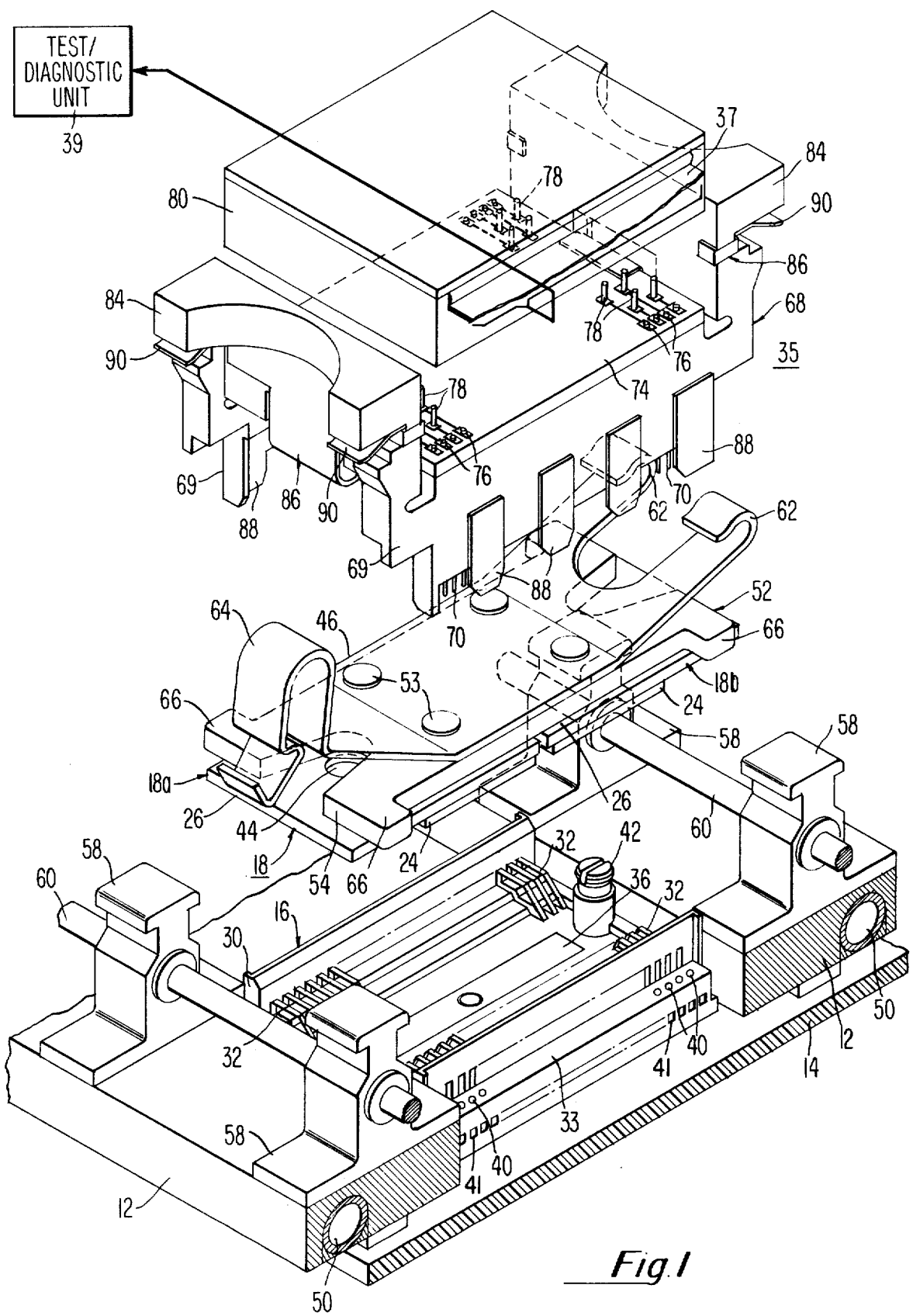
FIG. 1 is an exploded pictorial view of the connector and the elements with which it may be associated when employed in a system environment.

The pictorial view of FIG. 1 is partially based upon the packaging system described in the reference Braun et al application. The connector of the present invention finds particular application in this system, and its features and advantages are best appreciated when considered in such an environment. The system details which follow are to be considered illustrative, rather than limitative of the invention.

General reference should be made to FIG. 1 throughout the following description, and specific reference to the other Figures where indicated, to enhance an understanding of the invention. Like reference characters have been used throughout to designate similar components. For purposes of explanation, FIG. 1 depicts the elements of a unitary portion of a packaging system. Included are a cooling frame 12 with tubing 50, and the interconnection plate or medium 14 for supporting connector 16. The integrated circuit package 18 which is preferably of the leadless ceramic type described in the reference Morse copending application, is adapted to plug into the connector. Also illustrated are the hold-down device 52 described and claimed in the reference Klein et al. application, and a probing device 35 suitable for use with connector 16.

Figure 3:
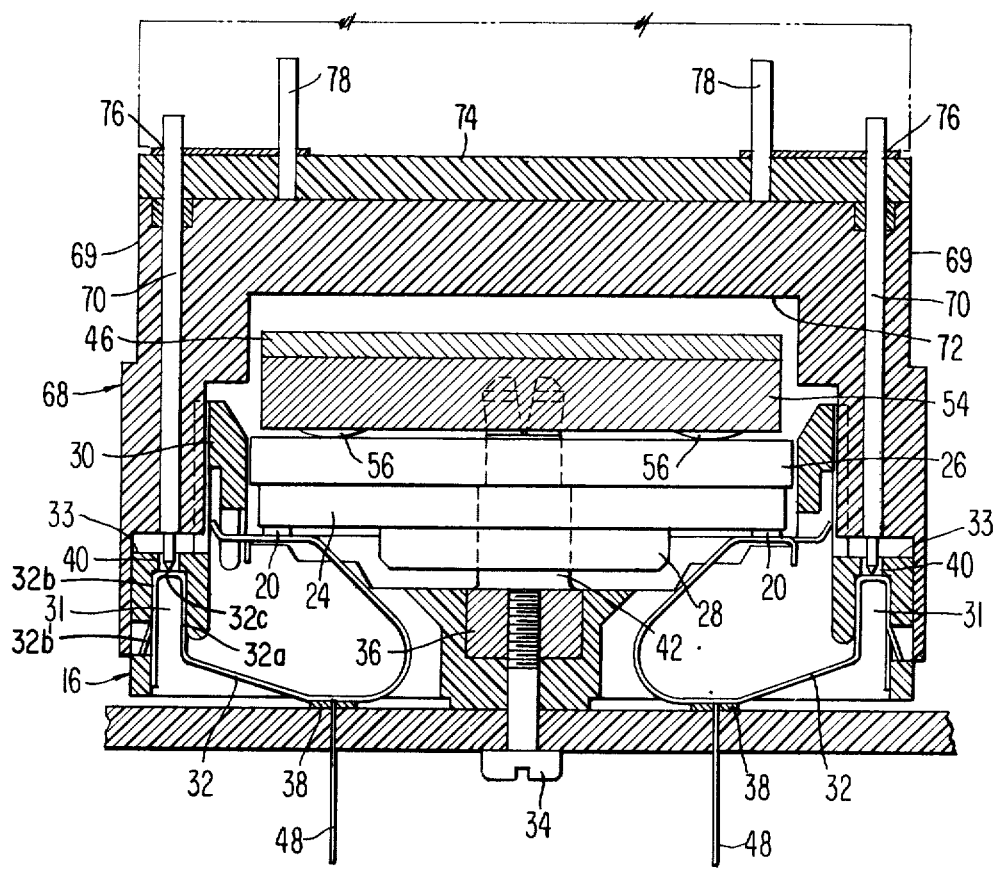
FIG. 3 is a section view taken along lines 2—2 of FIG. 2 to better illustrate the engaging of the connector contact elements by the elements of the probe device.

Considering each of the major components in turn and their relationship to one another, the integrated circuit package 18 will receive initial consideration. As seen in FIGS. 1 and 3, the total integrated circuit package 18 may comprise a pair of "leadless" pluggable package components 18a and 18b of either SSI or MSI variety, each component having a plurality of leads 20 (which, for example, may number 24) plus a ground connection (not shown). shown). This is the so called "split-package" configuration. It should be understood that a single 50 lead LSI package could also be employed without modification of the package connector 16. In either case, in an actual operative embodiment, the leads are arranged so that half the total number appear on opposite sides of the package, with a typical lead center-to-center spacing of 0.050 inches. As noted hereinbefore, the integrated circuit packages may be of the type described in the reference Morse copending application. In accordance with the latter and continued reference to FIGS. 1 and 3, the leadless package 18 may utilize a ceramic body 24 having the silicon chip (not shown) hermetically sealed in a cavity formed therein. The internal leads of the package for providing access to the chip are adhered to a layer of glass fused to the ceramic body 24. A carrier or metallic heat sink member 26 is fused to the entire lower surface of the ceramic body. The ceramic between the integrated circuit chip and the heat sink 26 is made sufficiently thin to give good heat conduction while maintaining electrical insulation. The heat sink member 26 has integral extensions at its opposite extremes which are adapted to be clamped against the cooling frame 12 as will be described in more detail hereinafter. In order to provide a ground connection for the integrated circuit, the package ground leads are connected to the package heat sink 26 which provides an electrical path to the cooling frame 12 in addition to the thermal path. A lid or cover 28 which may be of ceramic or a suitable metal alloy protects the integrated circuit chip.

Figure 2:
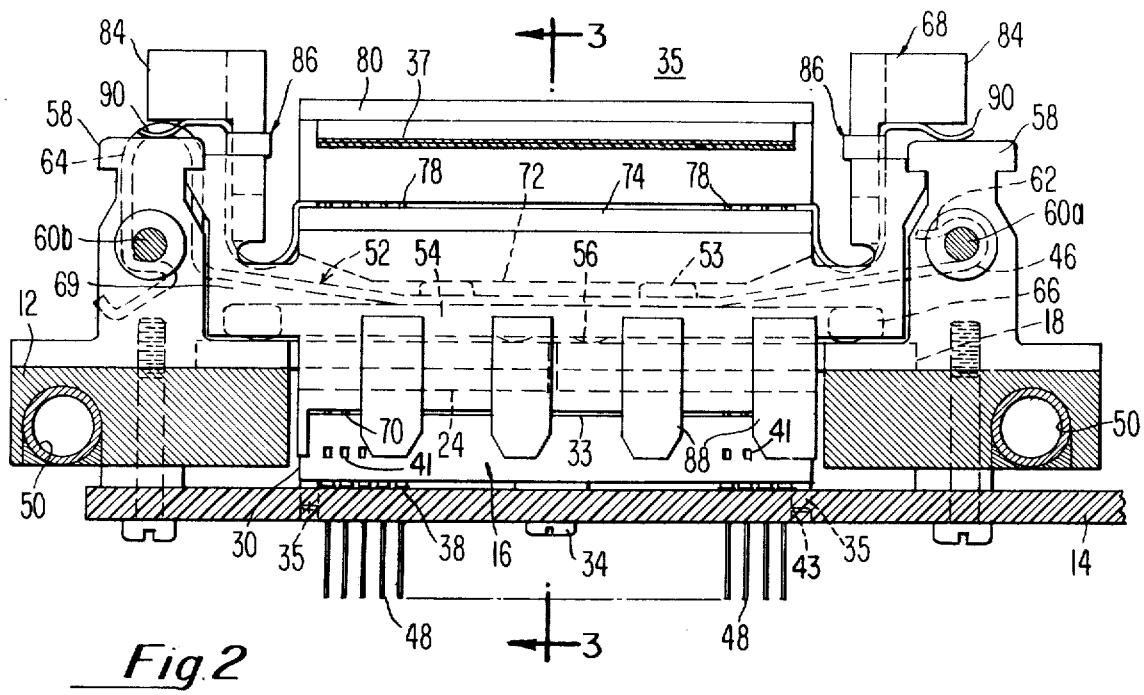
FIG. 2 is a side view of the connector and the elements of FIG. 1, shown in an assembled condition.

In order to make electrical contact with the terminal portions of the integrated circuit package leads 20, the connector 16 of the present invention as seen in FIGS. 1 – 3 is provided. The connector comprises a molded body 30 of insulative material and a plurality of contacts 32, one for each of the package terminals. Each connector is fastened to the interconnection medium 14 (which may be of the printed circuit board variety) by any suitable means, such as screw 34, threaded into a metallic member 36, as seen in FIG. 3. A pair of locating pins 35 (FIG. 2) situated on the underside of the connector body 30 mate with the holes 43 in the interconnection medium 14. These pins serve to position the lower contact elements 32 over the conductive pads 38. The integrated circuit package 18 which may be of the single chip variety (not shown), or a pair of split-packages (FIG. 1) are placed in the connector 16. As seen clearly in FIG. 3, each contact 32 is in the form of a continuous loop comprised of adjacent geometrical sections. The first section is generally in the form of a "C" in which its upper portion presses against a terminal lead 20 of the integrated circuit package 18 and its lower portion, against a conductive pad 38 on the interconnection medium 14. The other contact section is an extension of the former, and follows the contour of a substantially rectangular slotted region 31 within the connector body 30. As such, it has a generally U-shaped configuration in which one leg 32a is integral with the remainder of the contact elements 32, the other leg 32b lies along the inner surface of the side of the connector body, and a transverse member 32c joins the two legs. A ledge 33 along each longitudinal side of the connector body 30 has discrete apertures 40 therein situated respectively above the last mentioned transverse members 32c. A plurality of discrete openings 41 in each of the sides of the connector body lead from the outside surface thereof to the internal slotted region 31. Each ledge aperture 40 has a corresponding side opening 41. The leg 32b of the U-shaped portion of the contact element has a tab-like projection 32b' which is oriented at an acute angle to the remainder of leg 32b. This projection engages the material surrounding the opening 41, and renders the U-shaped contact portion immobile within the slotted region 31. The ledge apertures 40 permit the electrical probing of the contacts while the integrated circuit packages are in place and the system is operative. Utilizing standard test equipment, such as an oscilloscope or meter, the instrument probe may be inserted into one or more of the aforesaid ledge apertures 40 in turn to examine the signals appearing thereon. Alternately, the probe device 35 shown in FIG. 1, may be employed. This device has a plurality of contact elements which simultaneously engage the respective connector contacts through the apertures 40. The signal levels on the last mentioned contacts may then be transmitted via a multiconductor cable 37 to a test and diagnostic unit 39. The details of the probe device 35 will be considered hereinafter.

It is significant to note that the application of probing forces to member 32c of the U-shaped contact portion, does not physically disturb the remainder of the contact 32.

As seen in FIGS. 1 and 3, another feature of the connector 16 is the use of a pair of package alignment and retention pins 42. In order to insert the integrated circuit package 18, the split top on each of these pins is gently pressed together in order that the pin may be inserted through the holes 44 provided in the integrated circuit package carrier 26. This arrangement serves to prevent the inadvertent dislodging of the package from the connector particularly when the force exerted by the hold down spring 46 (FIG. 1) to be described in greater detail hereinafter, is suddenly released. As seen in FIG. 3, the connector contacts 32 press against the conductive pads 38 of the interconnection medium 14. These pads in turn may be connected to pins 48 which protrude through the medium and which may then be interconnected by various wiring means, such as wire wrap techniques. Alternately, while not shown, the aforementioned mode of wiring may be eliminated if the interconnection medium 14 incorporates printed wiring throughout. It is apparent that no holes are required in the interconnection medium 14 to accommodate the connectors 16 themselves. Moreover, no solder art assembly is required. This arrangement provides much freedom in the design of the interconnect medium and a single connector design is compatible with a wide variety of interconnect means.

As seen particularly in FIGS. 1 and 2, a cooling frame 12 is provided to facilitate the transfer of heat from the integrated circuit device 18. The frame 12 is fastened to the interconnection medium 14, which in turn supports the package connectors 16. A cooling liquid is pumped through a continuous tubing 50 to carry away the heat. As seen particularly in FIG. 2, when the integrated circuit package is placed in the connector 16, the extensions of its heat sink member 26 will tend to come to rest on the cooling frame 12.

As described and claimed in the reference Klein et al. application, and with reference to FIGS. 1 – 3 inclusive, in order to insure both electrical continuity between the connector contacts 32 and the integrated circuit package leads 20, and the proper thermal interface between the extensions of the package heat sink member 26 and the cooling frame 12, the hold down device 52 is provided. The device comprises a spring-like member 46 to which is secured by rivet-like attachments 53 a pressure plate 54, the latter having a number of formed protuberances 56 which bear against the package heat sink member 26. The hold down device 52 is positioned between adjacent members of the cooling frame 12 by virtue of groups of elevated brackets 58 fastened to the frame 12 and each group supporting a common rod 60 which passes therethrough. One end of the hold down spring-like member 46 is notched in a U-shaped configuration such that the extremities of the legs 62 of the "U" are wrapped around the rod 60a to prevent the hold down device 52 from coming free. The opposite end of member 46 which is a single projection 64 is configured to latch in opposition to the force of spring member 46 with the opposite rod 60b. It should be noted that the latch projection 64 is designed to contact the latter rod 60b and occupy the space formed by the U-notch between the pair of legs 62 of the spring member in the same column and next succeeding row of hold down devices. The "ears" 66 on pressure plate 46 restrains downward motion of the latter even if only one of the package sections 18a or 18b is plugged into connector 16.

The probe device 35 mentioned briefly hereinbefore, includes a body 68 of insulative material, such as nylon. The profile of the lower part of body 68 is substantially arch-like, wherein the sides of the arch correspond to the longitudinal sides 69 of the device. Each of the sides has embedded therein a row of probe contacts 70, with center-to-center spacings identical to those between adjacent apertures 40 in the ledge 33 of connector body 30. The probe contacts 70 are preferably of the type which comprise a spring-actuated plunger, mounted in a body member — such as the POGO contacts, manufactured by Pylon, Inc. The transverse section 72 of the device is adapted to carry an interconnection board 74, which may be of the printed-wiring type. The ends of the probe contacts 70 are made to pass through section 72 and protrude slightly from board 74 and are terminated at points 76 along the opposite sides of board 74. The latter points are electrically connected to pins 78, arranged in staggered fashion to allow more space between adjacent pins, and are adapted to be received by receptacle 80. The receptacle also terminates a multi-conductor cable 37, each conductor of which carries the signal appearing on the connector contact 32 with which it is connected to a Test/Diagnostic unit 39.

The probe device 35 also includes an upper body part which comprises an elevated section 84 attached to the sides 69 of the probe body 68 and lying in a plane perpendicular thereto. A spring member 86 formed of sheet material and affixed to section 84 and board 74 applies a force to the latter section tending to keep it in an upright vertical position.

In use, the lower part of the probe 35 straddles the hold down device 52 and the connector 16, while the probe contacts 70 engage the connector contacts 32 through the openings 40. A plurality of thin-walled extensions 88 integral with the sides 69 of the probe body 68, overlie the outermost side wall portions of connector body 30 when the probe is in place. These extensions 88 tend to guide the probe contacts 70 to their destinations and lend physical support to the device. It should be noted, that the design of probe 35 is such that even where a plurality of connectors 16 are mounted side by side in a row/column relationship (as in the island arrangement taught in the reference Braun et al. application), the devices may be used on adjacent connectors without physical interference.

The front faces of the respective upper sections 84 of the device are formed to mate with the notched portions of the spring hold down rod support members 58. Thus, during installation, as the device 35 is pushed down to engage the connector contacts 32, the upper sections 84 are simultaneously squeezed toward each other, and then released when the probe contacts 70 are seated. The spring members 86, as implied previously, urge the upper sections toward the support members 58 to "lock" them into position. The springs also serve an additional function. The tab-like projections 90 on either side thereof contact the top surface of the support members 58 and since these members are part of the system ground, the springs provide an electrical ground path to board 74. The availability of this ground connection on board 74 is considered useful in connection with the examination of signal levels on pins 78.

In summary, there has been described a connector for use with leadless integrated circuit packages in high speed electronic systems. The connector is distinguished by the ease with which its electrical contacts may be probed and the signal levels thereon examined during operation of the integrated circuits. Depending upon particular requirements, changes and modifications of the connector may be necessary. Such changes and modifications, insofar as they are not departures from the true scope of the invention are intended to be covered by the claims appended hereto.

What is claimed is:

1. A connector assembly for mounting an integrated circuit package comprising:
    a body member of electrically insulative material having two of its sides oriented longitudinally, said body member having internal substantially rectangular slotted sections disposed in planes parallel respectively to said sides, pluralities of electrical contact elements positioned in spaced apart longitudinal relation along respective ones of said sides, each of said contact elements having a portion thereof situated along the contour of one of said slotted sections and assuming a general U-shaped configuration comprising one leg integral with the remainder of said contact element, a second leg lying along the inner surface of the side of said body member, and a transverse member joining the two legs, said body member having external ledge sections extending respectively along said sides and enclosing a portion of said slotted sections, said ledge sections having a plurality of discrete apertures, a plurality of discrete openings in each of the sides of said body member leading from the outside surface thereof to said internal slotted sections, each ledge aperture having a corresponding side opening, both said ledge apertures and side openings being spaced apart in homologous relationship with the portions of said contact elements situated in said slotted sections, each of said transverse members of said U-shaped portions of the contact elements lying below one of said ledge apertures, each of said second legs of said portions of the contact elements including a tab-like projection for engaging the material surrounding said side opening and rendering said U-shaped portion of said contact element immobile within said slotted section, the electrical probing of said contact elements being permitted by way of said ledge apertures and the transverse members of said U-shaped portions of the contact elements, the remainder of each of said contact elements being physically undisturbed by said probing.

2. A connector assembly as defined in claim 1 wherein said electrical contact elements comprise a continuous loop having in addition to said portion situated along the contour of said slotted section an additional portion formed in a substantially C-shaped configuration.

3. A connector assembly as defined in claim 2 further including means for probing said electrical contact elements by way of said apertures.

4. A connector assembly as defined in claim 3 wherein said probing means comprises a device having a body of electrically insulative material, the lower part of said body having a substantially arch-like profile wherein the sides of the arch define the longitudinal sides of said device, each of said longitudinal sides having embedded therein a row of probe contacts, a plurality of thin-walled extensions integral with the sides of said device body, said probe contacts being spaced apart and in substantial alignment with said apertures in said ledge sections of said connector body member and being operatively disposed to simultaneously engage respective electrical contact elements by way of said apertures, the joining of said device with said connector causing said thin-walled extensions to overlie the outermost side wall portions of said connector body member in order to guide said probe contacts to their destinations.

5. A connector assembly as defined in claim 4 further characterized in that the body of said probing means includes a central part transverse to said longitudinal sides for supporting an interconnection board, said board having a plurality of pins, the extremities of said probe contacts opposite to those in engagement with said connector contact elements penetrating said central part and terminating at points on said board, and conductive means connecting the probe contact termination points to respective ones of said plurality of pins.

6. A connector assembly for mounting a leadless integrated circuit package in a system which includes an interconnection medium having a plurality of conductive pads, and a package hold down device supported by bracket means, comprising:

a body member of electrically insulative material having two of its sides oriented longitudinally, said body member having internal substantially rectangular slotted sections disposed in planes parallel respectively to said sides, pluralities of electrical contact elements positioned in spaced apart longitudinal relation along respective ones of said sides, each of said contact elements being formed in a continuous loop which includes a pair of contiguous parts, a first of said parts having a substantially C-shaped configuration wherein an upper portion thereof is adapted to contact a lead of said integrated circuit package and a lower portion thereof is adapted to contact a conductive pad of said interconnection medium, the second of said parts being situated along the contour of one of said slotted sections and assuming a general U-shaped configuration comprising one leg integral with the remainder of said contact element, a second leg lying along the inner surface of the side of said body member, and a transverse member joining the two legs, said body member having external ledge sections extending respectively along said sides and enclosing a portion of said slotted sections, said ledge sections having a plurality of discrete apertures, a plurality of discrete openings in each of the sides of said body member leading from the outside surface thereof to said internal slotted sections, each ledge aperture having a corresponding side opening, both said ledge apertures and said openings being spaced apart in homologous relationship with the second parts of said contact elements, each of said transverse members of said second parts of the contact elements lying below one of said ledge apertures, each said second leg of a second part of the contact element including a tab-like projection for engaging the material surrounding said side opening and rendering said second part immobile within said slotted section, the electrical probing of said contact elements being permitted by way of said ledge apertures and the transverse members of the second parts of the contact elements, the first part of each of said contact elements being physically undisturbed by said probing.

7. A connector assembly as defined in claim 6 further including means for probing said electrical contact elements by way of said apertures.

8. A connector assembly as defined in claim 7 wherein said probing means comprises a device having a body of electrically insulative material, the lower part of said body having a substantially arch-like profile wherein the sides of the arch define the longitudinal sides of said device, each of said longitudinal sides having embedded therein a row of probe contacts, said probe contacts being spaced apart and in substantial alignment with said apertures in said ledge sections of said body member and being operatively disposed to simultaneously engage respective electrical contact elements by way of said apertures, the central part of said body being transverse to said longitudinal sides of said device, the upper part of said body comprising a pair of elevated sections at opposite ends thereof, each of said sections being attached to the corresponding extremities of the sides of said device and being oriented in a plane perpendicular to said sides, the front faces of said elevated sections being formed to mate with the contour of the package hold down bracket means, whereby said probing means device is adapted to straddle said hold down device and to be "locked" into an operative position.

9. A connector assembly as defined in claim 8 further including an interconnection board affixed to the surface of said central part of said body, said board having a plurality of pins arranged in staggered fashion and emanating from a common surface of said board, the extremities of said probe contacts opposite to those in engagement with said connector contact elements penetrating said central part of said body and terminating at points on said board, means connecting the probe contact termination points to respective ones of said plurality of pins, and receptacle means including an interconnect cable for receiving said pins and for conveying to test and disgnostic means the signal levels appearing on said pins during operation of said system.

10. A connector assembly as defined in claim 9 further including a spring member configured to contact the front surface of each of said elevated sections and to be affixed at one of its extremities to said interconnection board, said spring member exerting a force on said elevated section tending to keep it in an upright position and "locked" into said bracket means, said spring member having tab-like projections on the other of its extremities to contact the surface of said hold down bracket means, said spring member thereby providing an electrical circuit path from said bracket means to said interconnection board.

* * * * *